United States Patent
Joung et al.

(10) Patent No.: US 9,344,118 B2
(45) Date of Patent: May 17, 2016

(54) APPARATUS AND METHOD FOR GENERATING INTERLEAVER INDEX

(75) Inventors: Jinsoup Joung, Seongnam-si (KR); Joohyeong Lee, Seoul (KR); Jongho Lim, Seoul (KR); Jaehwan Kim, Seongnam-si (KR)

(73) Assignee: INNOWIRELESS CO., LTD. (KR)

( * ) Notice: Subject to any disclaimer, the term of this patent is extended or adjusted under 35 U.S.C. 154(b) by 74 days.

(21) Appl. No.: 14/370,571

(22) PCT Filed: Feb. 24, 2012

(86) PCT No.: PCT/KR2012/001441
§ 371 (c)(1),
(2), (4) Date: Jul. 3, 2014

(87) PCT Pub. No.: WO2013/115429
PCT Pub. Date: Aug. 8, 2013

(65) Prior Publication Data
US 2015/0026535 A1 Jan. 22, 2015

(30) Foreign Application Priority Data

Feb. 2, 2012 (KR) .......... 10-2012-0010658

(51) Int. Cl.
*G06F 11/00* (2006.01)
*H03M 13/00* (2006.01)
(Continued)

(52) U.S. Cl.
CPC ........ *H03M 13/2771* (2013.01); *H03M 13/276* (2013.01); *H03M 13/2739* (2013.01); *H03M 13/6561* (2013.01); *H03M 13/395* (2013.01)

(58) Field of Classification Search
None
See application file for complete search history.

(56) References Cited

U.S. PATENT DOCUMENTS

| 7,089,480 B2 * | 8/2006 | Yun | H03M 13/11 |
| | | | 714/755 |
| 8,281,086 B2 | 10/2012 | Chi | |

(Continued)

FOREIGN PATENT DOCUMENTS

| JP | 01267713 | 10/1989 |
| JP | 05145429 | 6/1993 |

(Continued)

OTHER PUBLICATIONS

Shuenn-Gi Lee et al., Architecture Design of QPP Interleaver for Parallel Turbo Decoding, IEEE, 2010.

(Continued)

*Primary Examiner* — Daniel McMahon
(74) *Attorney, Agent, or Firm* — Cantor Colburn LLP (57) ABSTRACT

An apparatus for generating indexes of an interleaver for input data comprises: a main processor for calculating an index for a predetermined bit of the input data; and an index operator for receiving the index calculated by the main processor, calculating in parallel indexes for bits after the predetermined bit, and deriving a plurality of indexes. The main processor calculates the index for $i^{th}$ to $(i+15)^{th}$ bits of the input data where i is an integer equal to or larger than 0, and transfers a result of $(128*f_2) \bmod K$ to the index operator. The index operator calculates an index for an $(i+j+16)^{th}$ bit where j is an integer which satisfies $0 \leq j \leq 7$ by using an equation of $\Pi(i+j+16) = (2*\Pi(i+j+8) - \Pi(i+j) + 128*f_2) \bmod K$ where K is a size of the input data and $f_2$ is a coefficient calculated from K.

8 Claims, 6 Drawing Sheets

(51) Int. Cl.
*H03M 13/27* (2006.01)
*H03M 13/39* (2006.01)

(56) References Cited

U.S. PATENT DOCUMENTS

| | | | |
|---|---|---|---|
| 2006/0242475 A1* | 10/2006 | Sandhu | H03M 13/27 |
| | | | 714/701 |
| 2007/0220377 A1 | 9/2007 | Park et al. | |
| 2008/0091986 A1* | 4/2008 | Nimbalker | H03M 13/275 |
| | | | 714/701 |
| 2008/0133998 A1* | 6/2008 | Nimbalker | H03M 13/275 |
| | | | 714/755 |
| 2009/0138668 A1 | 5/2009 | Blankenship | |
| 2011/0066914 A1 | 3/2011 | Lee et al. | |
| 2011/0113307 A1* | 5/2011 | Kang | H03M 13/2903 |
| | | | 714/786 |
| 2011/0116359 A1* | 5/2011 | Li | H04L 1/0043 |
| | | | 370/208 |

FOREIGN PATENT DOCUMENTS

| | | |
|---|---|---|
| JP | 2006320014 | 11/2006 |
| KR | 1020040026505 | 3/2004 |
| KR | 1020090003986 | 1/2009 |
| KR | 1020120027405 | 3/2012 |
| WO | 2008057041 | 5/2008 |

OTHER PUBLICATIONS

Asghar, Flexible Interleaving Sub-systems for FEC in Baseband Processors, Linkoping Studies in Science and Technology, 2010, pp. 1-216.

European Search Report—European Application No. 12867539.4 issued on Aug. 11, 2015, citing "Efficient hardware implementation of a highly-parallel 3GPP LTE/LTE-advance turbo decoder", "Flexible Interleaving Sub-systems for FEC in Baseband Processors", US 2009/138668 and WO 2008/057041.

Sun, et al., Efficient hardware implementation of a highly-parallel 3GPP LTE/LTE-advance turbo decoder, Integration, the VLSI journal, 2011, pp. 305-315.

International Search Report—PCT/KR2012/001441 dated Feb. 19, 2013.

* cited by examiner

Figure 1

*Prior Art*

Figure 7

APPARATUS AND METHOD FOR GENERATING INTERLEAVER INDEX

TECHNICAL FIELD

The present invention relates to an apparatus and a method for generating an interleaver index, and more particularly to an apparatus and a method for generating an internal interleaver index of a turbo encoder in parallel.

BACKGROUND ART

In general, the relation between an input and an output of an internal interleaver of a turbo encoder follows the below equation when inputs are $C_0, C_1, C_2, \ldots C_{k-1}$ and outputs are $C'_0, C'_1, C'_2, \ldots C'_{k-1}$.

$$C'_i = C'_{\Pi(i)}, i=0, 1, 2, \ldots K-1$$

Further, indexes of an input stream and an output stream follow the below equation.

$$\Pi(i) = (f_1 * i + f_2 * i^2) \bmod K$$

Figure 1:
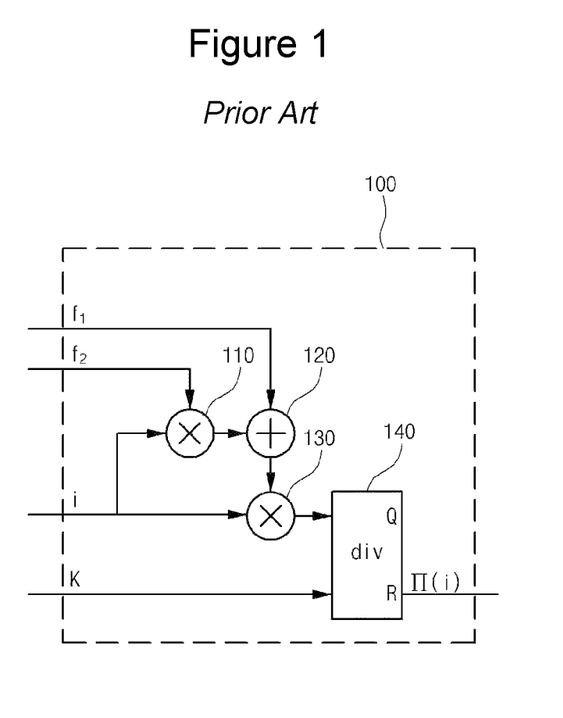
FIG. 1 is a diagram illustrating the apparatus for generating the internal interleaver index of the conventional turbo encoder.

FIG. 1 is a diagram illustrating an apparatus 100 for generating an internal interleaver index of a conventional turbo encoder.

Referring to FIG. 1, the apparatus 100 for generating the internal interleaver index of the conventional turbo encoder includes a first multiplier 110, an adder 120, a second multiplier, and a divider 140.

The apparatus 100 for generating the internal interleaver index of the conventional turbo encoder receives inputs of K, which is a size of input data, $f_1$ and $f_2$ calculated from K, and a value of i according to an order of bits and outputs $\Pi(i)$ satisfying $$\Pi(i) = (f_1 * i + f_2 * i^2) \bmod K.$$

The first multiplier 110 receives inputs of $f_2$ and i and outputs a value of $f_2 * i$.

The adder 120 receives inputs of i and $f_2 * i$ output through the first multiplier 110 and outputs a value of $f_2 * i + f_1$.

The second multiplier 130 receives inputs of i and $f_2 * i + f_1$ output through the adder 120 and outputs a value of $(f_2 * i + f_1) * i$.

The divider 140 receives inputs of K and $(f_2 * i + f_1) * i$, performs $(f_2 * i + f_1) * i / K$, and then outputs $(f_2 * i + f_1) * i \bmod K$ corresponding to the remainder.

The apparatus 100 for generating the internal interleaver index of the conventional turbo encoder outputs the index in the unit of bits, so that the time for generating the index is increased in proportion to the size of the input data. As a result, the performance of the apparatus is deteriorated.

Further, there is a problem in that the apparatus 100 for generating the internal interleaver index of the conventional turbo encoder requires the multiplier and the divider, which have high importance in an aspect of the hardware implementation, in order to generate the index.

DISCLOSURE OF INVENTION

Technical Problem

An aspect of the present invention provides an apparatus and a method for generating an interleaver index, which calculates indexes for following bits by using an index value extracted for a predetermined bit of input data while generating interleaver indexes for a plurality of bits in parallel.

Solution to Problem

In accordance with an aspect of the present invention, there is provided an apparatus for generating indexes of an interleaver for input data, the apparatus including a main processor for calculating an index for a predetermined bit of the input data; and an index operator for receiving the index calculated by the main processor, calculating in parallel indexes for bits after the predetermined bit, and deriving a plurality of indexes.

The main processor or the index operator may calculate the index by using a difference between indexes.

The index for the predetermined bit may be calculated by an equation of $$\Pi(i+1) - \Pi(i) = (f_1 + f_2 + 2 * f_2 * i) \bmod K$$

A modular operation may be performed using an addition and a multiplexer.

The addition may be an addition of a dividend and a sign inverted divisor of the modular operation, and the multiplexer may receive inputs of a result of the addition and the dividend, wherein the multiplexer may output the dividend when the result of the addition is a negative number and output the result of the addition when the result of the addition is a positive number.

The main processor may calculate indexes for $i^{th}$ to $i+15^{th}$ bits (i is an integer equal to or larger than 0) of the input data, and the index operator may calculate an index for an $(i+j)+16^{th}$ bit ($0 \leq j \leq 7$) by using a difference between $i+j^{th}$ and $(i+j)+8^{th}$ bits.

The main processor may calculate $(128 * f_2) \bmod K$ and transfer the calculated $(128 * f_2) \bmod K$ to the index operator, and the index operator may calculate an index by using an equation of $$\Pi(i+j+16) = (2 * \Pi(i+j+8) - \Pi(i+j) + 128 * f_2) \bmod K$$

($0 \leq j \leq 7$).

The modular operation may be performed using a first addition, a second addition, and a multiplexer through receptions of a first input, a second input, and a divisor of K.

The first addition may be an addition of the first input and a sign inverted second input, the second addition may be an addition of a result of the first addition and a divisor of K, and the multiplexer receives inputs of the result of the first addition and a result of the second addition and outputs the result of the second addition when the result of the first addition is a negative number and outputs the result of the first addition when the result of the first addition is a positive number.

In accordance with another aspect of the present invention, there is provided a method of generating indexes of an interleaver for input data, the method including performing a first step by calculating an index for a predetermined bit of the input data; and performing a second step by calculating indexes for bits after the predetermined bit in parallel by using the calculated index.

In the first step, a difference between indexes for bits may be calculated by an equation of $\Pi(i+1) - \Pi(i) = (f_1 + f_2 + 2 * f_2 * i) \bmod K$ and indexes for bits after the bit may be calculated using the calculated index.

A modular operation may be performed using an addition and a multiplexer, wherein the addition may be an addition of a dividend and a sign inverted divisor of the modular operation, and the multiplexer may receive inputs of a result of the addition and the dividend, wherein the multiplexer may output the dividend when the result of the addition is a negative number and output the result of the addition when the result of the addition is a positive number.

$(128*f_2)$modK and indexes for $i^{th}$ to $i+15^{th}$ bits (i is an integer equal to or larger than 0) of the input data may be calculated in the first step, and indexes for bits from an i+16 bit may be calculated using an equation of $$\Pi(i+j+16)=(2*\Pi(i+j+8)-\Pi(i+j)+128*f_2) \bmod K$$

($0 \leq j \leq 7$) in the second step.

The modular operation may be performed using a first addition, a second addition, and a multiplexer through receptions of a first input, a second input, and a divisor of K, wherein the first addition may be an addition of the first input and a sign inverted second input, the second addition may be an addition of a result of the first addition and the divisor of K, and the multiplexer may receive inputs of the result of the first addition and a result of the second addition and output the result of the second addition when the result of the first addition is a negative number and output the result of the first addition when the result of the first addition is a positive number.

Specific matters of other embodiments are included in the detailed description and drawings.

Advantageous Effects of Invention

The present invention has an effect of reducing the time spent for generating total indexes by generating indexes for a plurality of bits in parallel.

Also, the present invention has an effect of improving the resource efficiency and the performance in the hardware implementation by calculating indexes for following bits through the use of an index calculated for a predetermined bit without the use of a multiplier and a divider.

BRIEF DESCRIPTION OF DRAWINGS

The foregoing and other objects, features and advantages of the present invention will become more apparent from the following detailed description when taken in conjunction with the accompanying drawings in which.

MODE FOR THE INVENTION

The above and other objects, features and advantages of the present invention will be more apparent from the following detailed description taken in conjunction with the accompanying drawings. While the detailed description of the present invention has described certain exemplary embodiments such as a portable terminal, it will be understood by those skilled in the art that various changes in form and details may be made therein without departing from the spirit and scope of the invention as defined by the appended claims. Meanwhile, the terms used herein are only for describing embodiments of the present invention and do not limit the present invention.

Figure 2:
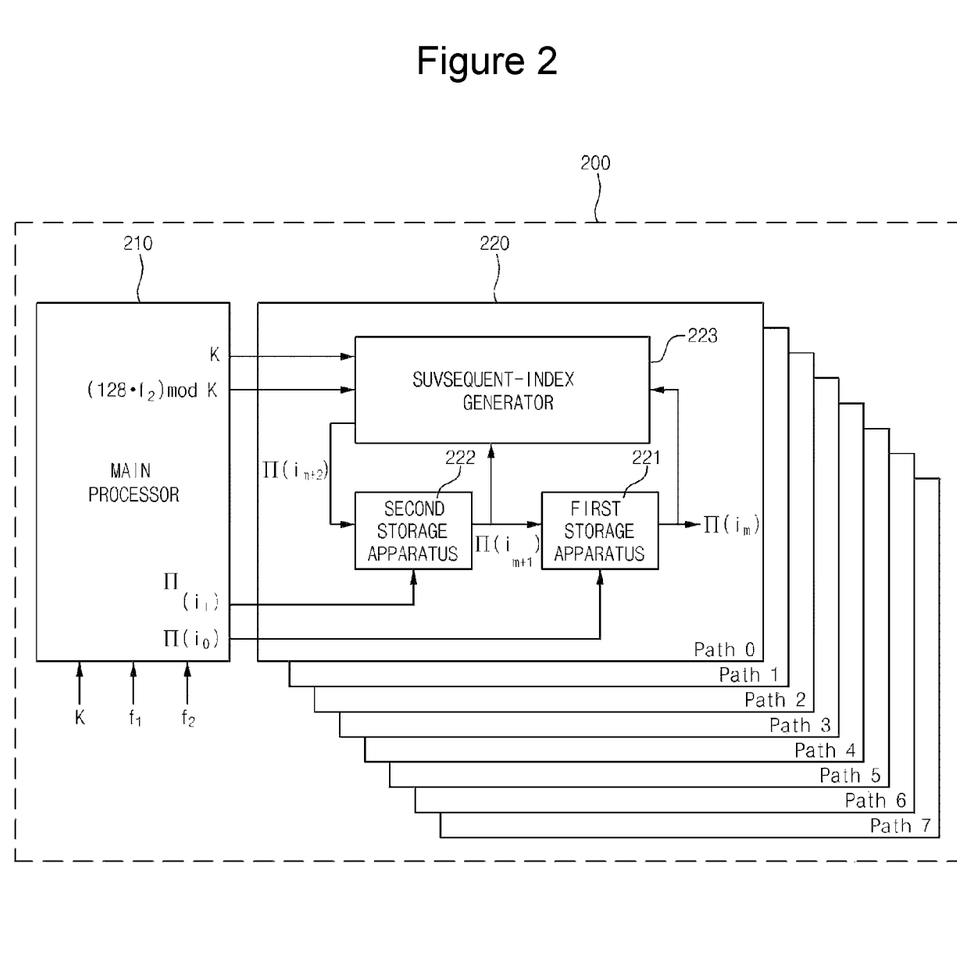
FIG. 2 is a diagram illustrating an interleaver index generating apparatus according to an embodiment of the present invention.

FIG. 2 is a diagram illustrating an interleaver index generating apparatus 200 according to an embodiment of the present invention. Referring to FIG. 2, the interleaver index generating apparatus 200 includes a main processor 210 and eight index operators 220. Each of the index operators 220 includes a first storage apparatus 221, a second storage apparatus 222, and a subsequent-index generator 223.

The interleaver index generating apparatus 200 according to the embodiment of the present invention generates indexes of the interleaver for input data.

The indexes of the interleaver correspond to $\Pi(i)$ satisfying the an equation of $\Pi(i)=(f_1*i+f_2*i^2) \bmod K$, and $f_1$ and $f_2$ derived from the input data and values of i according to an order of bits are used in the above equation.

For example, parameters used in the above equation are as defined in the below table.

TABLE 1

| i | Ki | f1 | f2 |
|---|-----|-----|-----|
| 1 | 40 | 3 | 10 |
| 2 | 48 | 7 | 12 |
| 3 | 56 | 19 | 42 |
| 4 | 64 | 7 | 16 |
| 5 | 72 | 7 | 18 |
| 6 | 80 | 11 | 20 |
| 7 | 88 | 5 | 22 |
| 8 | 96 | 11 | 24 |
| 9 | 104 | 7 | 26 |
| 10 | 112 | 41 | 84 |
| 11 | 120 | 103 | 90 |
| 12 | 128 | 15 | 32 |
| 13 | 136 | 9 | 34 |
| 14 | 144 | 17 | 108 |
| 15 | 152 | 9 | 38 |
| 16 | 160 | 21 | 120 |
| 17 | 168 | 101 | 84 |
| 18 | 176 | 21 | 44 |
| 19 | 184 | 57 | 46 |
| 20 | 192 | 23 | 48 |
| 21 | 200 | 13 | 50 |
| 22 | 208 | 27 | 52 |
| 23 | 216 | 11 | 36 |
| 24 | 224 | 27 | 56 |
| 25 | 232 | 85 | 58 |
| 26 | 240 | 29 | 60 |
| 27 | 248 | 33 | 62 |
| 28 | 256 | 15 | 32 |
| 29 | 264 | 17 | 198 |
| 30 | 272 | 33 | 68 |
| 31 | 280 | 103 | 210 |
| 32 | 288 | 19 | 36 |
| 33 | 296 | 19 | 74 |
| 34 | 304 | 37 | 76 |
| 35 | 312 | 19 | 78 |
| 36 | 320 | 21 | 120 |
| 37 | 328 | 21 | 82 |
| 38 | 336 | 115 | 84 |
| 39 | 344 | 193 | 86 |
| 40 | 352 | 21 | 44 |
| 41 | 360 | 133 | 90 |
| 42 | 368 | 81 | 46 |
| 43 | 376 | 45 | 94 |
| 44 | 384 | 23 | 48 |
| 45 | 392 | 243 | 98 |
| 46 | 400 | 151 | 40 |
| 47 | 408 | 155 | 102 |
| 48 | 416 | 25 | 52 |
| 49 | 424 | 51 | 106 |
| 50 | 432 | 47 | 72 |
| 51 | 440 | 91 | 110 |
| 52 | 448 | 29 | 168 |

TABLE 1-continued

| i | Ki | f1 | f2 |
|---|---|---|---|
| 53 | 456 | 29 | 114 |
| 54 | 464 | 247 | 58 |
| 55 | 472 | 29 | 118 |
| 56 | 480 | 89 | 180 |
| 57 | 488 | 91 | 122 |
| 58 | 496 | 157 | 62 |
| 59 | 504 | 55 | 84 |
| 60 | 512 | 31 | 64 |
| 61 | 528 | 17 | 66 |
| 62 | 544 | 35 | 68 |
| 63 | 560 | 227 | 420 |
| 64 | 576 | 65 | 96 |
| 65 | 592 | 19 | 74 |
| 66 | 608 | 37 | 76 |
| 67 | 624 | 41 | 234 |
| 68 | 640 | 39 | 80 |
| 69 | 656 | 185 | 82 |
| 70 | 672 | 43 | 252 |
| 71 | 688 | 21 | 86 |
| 72 | 704 | 155 | 44 |
| 73 | 720 | 79 | 120 |
| 74 | 736 | 139 | 92 |
| 75 | 752 | 23 | 94 |
| 76 | 768 | 217 | 48 |
| 77 | 784 | 25 | 98 |
| 78 | 800 | 17 | 80 |
| 79 | 816 | 127 | 102 |
| 80 | 832 | 25 | 52 |
| 81 | 848 | 239 | 106 |
| 82 | 864 | 17 | 48 |
| 83 | 880 | 137 | 110 |
| 84 | 896 | 215 | 112 |
| 85 | 912 | 29 | 114 |
| 86 | 928 | 15 | 58 |
| 87 | 944 | 147 | 118 |
| 88 | 960 | 29 | 60 |
| 89 | 976 | 59 | 122 |
| 90 | 992 | 65 | 124 |
| 91 | 1008 | 55 | 84 |
| 92 | 1024 | 31 | 64 |
| 93 | 1056 | 17 | 66 |
| 94 | 1088 | 171 | 204 |
| 95 | 1120 | 67 | 140 |
| 96 | 1152 | 35 | 72 |
| 97 | 1184 | 19 | 74 |
| 98 | 1216 | 39 | 76 |
| 99 | 1248 | 19 | 78 |
| 100 | 1280 | 199 | 240 |
| 101 | 1312 | 21 | 82 |
| 102 | 1344 | 211 | 252 |
| 103 | 1376 | 21 | 86 |
| 104 | 1408 | 43 | 88 |
| 105 | 1440 | 149 | 60 |
| 106 | 1472 | 45 | 92 |
| 107 | 1504 | 49 | 846 |
| 108 | 1536 | 71 | 48 |
| 109 | 1568 | 13 | 28 |
| 110 | 1600 | 17 | 80 |
| 111 | 1632 | 25 | 102 |
| 112 | 1664 | 183 | 104 |
| 113 | 1696 | 55 | 954 |
| 114 | 1728 | 127 | 96 |
| 115 | 1760 | 27 | 110 |
| 116 | 1792 | 29 | 112 |
| 117 | 1824 | 29 | 114 |
| 118 | 1856 | 57 | 116 |
| 119 | 1888 | 45 | 354 |
| 120 | 1920 | 31 | 120 |
| 121 | 1952 | 59 | 610 |
| 122 | 1984 | 185 | 124 |
| 123 | 2016 | 113 | 420 |
| 124 | 2048 | 31 | 64 |
| 125 | 2112 | 17 | 66 |
| 126 | 2176 | 171 | 136 |
| 127 | 2240 | 209 | 420 |
| 128 | 2304 | 253 | 216 |
| 129 | 2368 | 367 | 444 |
| 130 | 2432 | 265 | 456 |
| 131 | 2496 | 181 | 468 |
| 132 | 2560 | 39 | 80 |
| 133 | 2624 | 27 | 164 |
| 134 | 2688 | 127 | 504 |
| 135 | 2752 | 143 | 172 |
| 136 | 2816 | 43 | 88 |
| 137 | 2880 | 29 | 300 |
| 138 | 2944 | 45 | 92 |
| 139 | 3008 | 157 | 188 |
| 140 | 3072 | 47 | 96 |
| 141 | 3136 | 13 | 28 |
| 142 | 3200 | 111 | 240 |
| 143 | 3264 | 443 | 204 |
| 144 | 3328 | 51 | 104 |
| 145 | 3392 | 51 | 212 |
| 146 | 3456 | 451 | 192 |
| 147 | 3520 | 257 | 220 |
| 148 | 3584 | 57 | 336 |
| 149 | 3648 | 313 | 228 |
| 150 | 3712 | 271 | 232 |
| 151 | 3776 | 179 | 236 |
| 152 | 3840 | 331 | 120 |
| 153 | 3904 | 363 | 244 |
| 154 | 3968 | 375 | 248 |
| 155 | 4032 | 127 | 168 |
| 156 | 4096 | 31 | 64 |
| 157 | 4160 | 33 | 130 |
| 158 | 4224 | 43 | 264 |
| 159 | 4288 | 33 | 134 |
| 160 | 4352 | 477 | 408 |
| 161 | 4416 | 35 | 138 |
| 162 | 4480 | 233 | 280 |
| 163 | 4544 | 357 | 142 |
| 164 | 4608 | 337 | 480 |
| 165 | 4672 | 37 | 146 |
| 166 | 4736 | 71 | 444 |
| 167 | 4800 | 71 | 120 |
| 168 | 4864 | 37 | 152 |
| 169 | 4928 | 39 | 462 |
| 170 | 4992 | 127 | 234 |
| 171 | 5056 | 39 | 158 |
| 172 | 5120 | 39 | 80 |
| 173 | 5184 | 31 | 96 |
| 174 | 5248 | 113 | 902 |
| 175 | 5312 | 41 | 166 |
| 176 | 5376 | 251 | 336 |
| 177 | 5440 | 43 | 170 |
| 178 | 5504 | 21 | 86 |
| 179 | 5568 | 43 | 174 |
| 180 | 5632 | 45 | 176 |
| 181 | 5696 | 45 | 178 |
| 182 | 5760 | 161 | 120 |
| 183 | 5824 | 89 | 182 |
| 184 | 5888 | 323 | 184 |
| 185 | 5952 | 47 | 186 |
| 186 | 6016 | 23 | 94 |
| 187 | 6080 | 47 | 190 |
| 188 | 6144 | 263 | 480 |

That is, indexes generated from a first example in Table 1, in which is $K_i$=40, $f_1$=3, and $f_2$=10, are sequentially 0, 13, 6, 19, 12, 25, 18, 31, 24, 37, 30, 3, 36, 9, 2, 15, 8, 21, 14, 27, 20, 33, 26, 39, 32, 5, 38, 11, 4, 17, 10, 23, 16, 29, 22, 35, 28, 1, 34, 7.

The main processor 210 calculates an index for a predetermined bit of input data.

According to an exemplary embodiment of the present invention, the main processor 210 calculates an index for a predetermined bit of input data by using the difference between index values.

Figure 3:
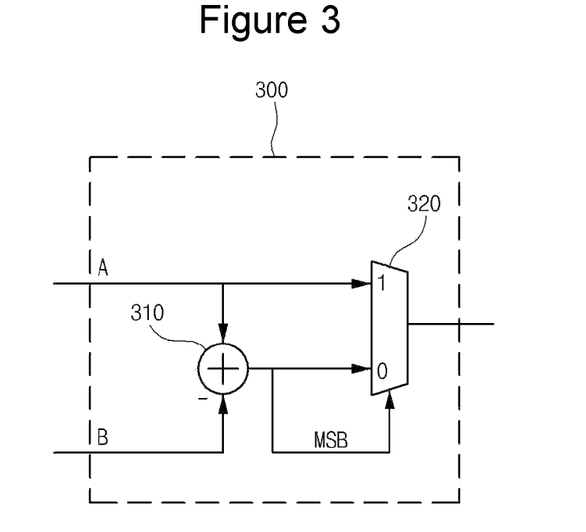
FIG. 3 is a diagram illustrating a modular circuit according to an embodiment of the present invention.

FIG. 3 is a diagram illustrating a modular circuit 300 according to an embodiment of the present invention. Referring to FIG. 3, the modular circuit 300 according to the embodiment of the present invention includes an adder 310 and a multiplexer 320.

A modular operation corresponds to an operation for outputting a remainder generated by multiplying a dividend by a divisor.

The adder 310 receives inputs of the dividend and the divisor and adds the dividend and a sign inverted divisor. That is, the adder 310 derives a value generated by subtracting the divisor from the dividend.

The multiplexer 320 receives inputs of a result of the addition and the dividend. The multiplexer outputs the dividend when the result of the addition is a negative number and outputs the result of the addition when the result of the addition is a positive number.

According to another exemplary embodiment of the present invention, the index for the predetermined bit is operated through the modular operation using the modular circuit 300 according to an embodiment of the present invention.

That is, although the main processor 210 does not provide the index operator 220 with the index value for the predetermined bit, the index for the predetermined bit may be operated through the modular circuit 300 according to the embodiment of the present invention and then the operated index may be provided to the index operator 220.

The modular circuit 300 according to the embodiment of the present invention has an effect of replacing the multiplier and the divider with the multiplexer and the adder, which are less important resources in an aspect of the hardware implementation.

The modular operation has an effect of managing efficient hardware resources through the replacement of the divider with the adder and the multiplexer, which are circuit elements having less importance in an aspect of the hardware implementation.

Figure 5:
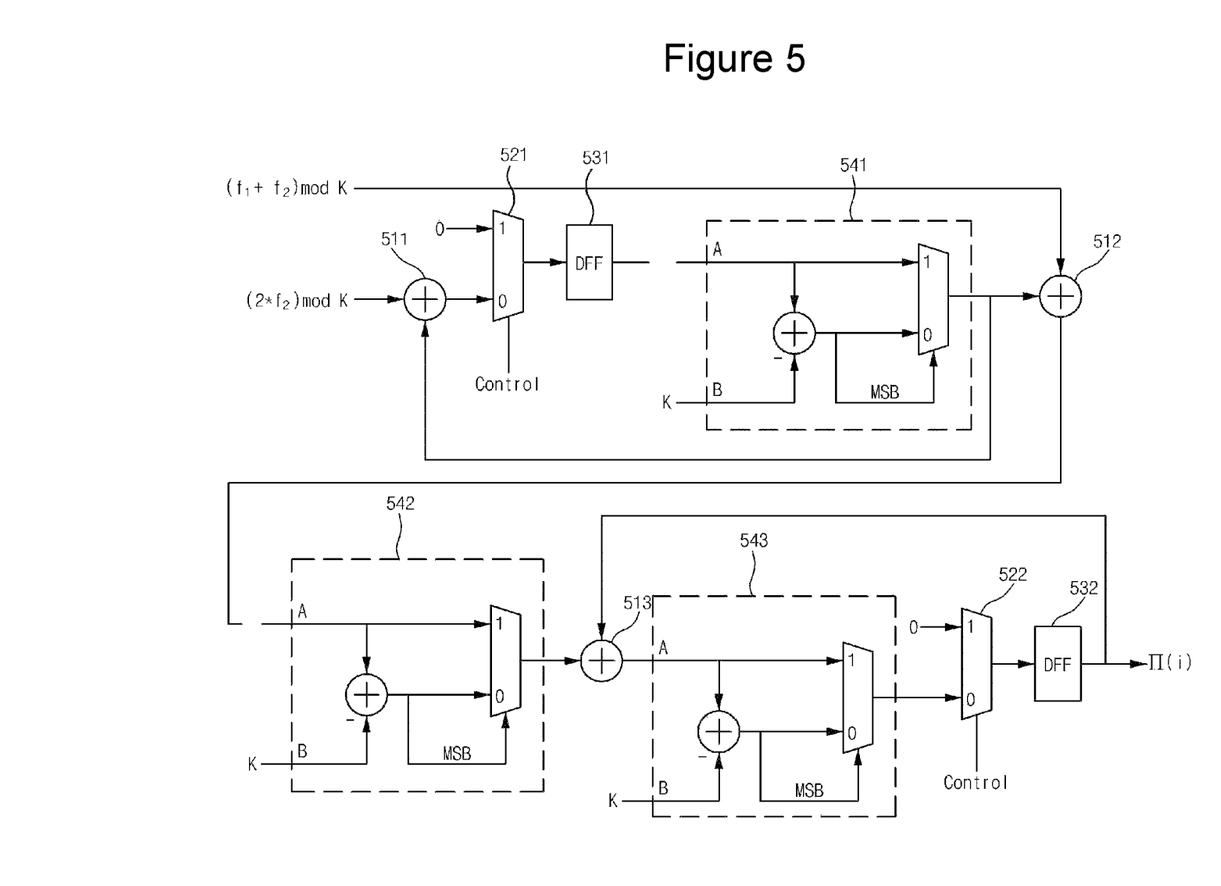
FIG. 5 is a diagram illustrating an interleaver index generating apparatus according to another embodiment of the present invention.

FIG. 5 is a diagram illustrating an interleaver index generating apparatus 500 according to another embodiment of the present invention. Referring to FIG. 5, the interleaver index generating apparatus 500 according to another embodiment of the present invention includes three adders 511, 512, and 513, two multiplexers 521 and 522, two D-flip flops 531 and 532, and three modular operators 541, 542, and 543.

The interleaver index generating apparatus 500 according to another embodiment of the present invention receives inputs of $(f_1+f_2)\text{mod}K$, $(2*f_2)\text{mod}K$, and K and sequentially outputs $\Pi(i)$.

The interleaver index generating apparatus 500 according to another embodiment of the present invention derives $\Pi(I)$ by using an equation of $$\Pi(i+1)-\Pi(i)=(f_1+f_2+2*f_2*i)\text{mod}K.$$

For easier understanding, the above equation is organized as follows.

$$\prod(i+1) - \prod(i) = \{f_1*(i+1) + f_2*(i+1)^2 - (f_1*i + f_2*i_2)\}\text{mod}K$$
$$= \{f_1*i + f_1 + f_2*i_2 + 2*f_2*i + f_2 -$$
$$(f_1*i + f_2*i_2)\}\text{mod}K$$
$$= (f_1 + f_2 + 2*f_2*i)\text{mod}K$$

That is, the difference between a current index value and a subsequent index value is calculated by adding $f_1+f_2$ and double of the value of $f_2$ multiplied by i, so that $\Pi(i)$ derived by the interleaver index generating apparatus 500 according to another embodiment of the present invention satisfies $\Pi(i)=(f_1*i+f_2*i^2)\text{mod}K$.

The first adder 511 receives an input of $(2*f_2)\text{mod}K$ and outputs a result value of the addition of $(2*f_2)\text{mod}K$ and an output value of the first modular operator 541. In an initial performance, it is not possible to receive the output value of the first modular operator 541 so the output value of the first adder 511 is in an unknown state.

The first multiplexer 521 receives inputs of the output value of the first adder 511 and "0", outputs "0" in generating a first index by a control signal, and then outputs the output value of the first adder 511 after that. The reason why "0" is generated as the first index is that a first index of the interleaver should be "0" and also a first output value of the first adder 511 is in an unknown state.

The first D-flip flop 531 receives an input of the output value of the first multiplexer 521 and temporarily stores the output value of the first multiplexer 521 because a loop-back is performed in which an output value of the first modular operator 541 is used in the first adder 511.

Further, the first D-flip flop 531 enables the accumulation of $2*f_2$ according to an increase of i in $\Pi(i+1)-\Pi(i)=(f_1+f_2+2*f_2*i) \text{ mod } K$ to be performed using the loop-back.

The first modular operator 541 receives inputs of K and the output value of the first D-flip flop 531 and performs the modular operation described through FIG. 3.

The second adder 512 outputs a result of the addition of the output value of the first modular operator 541 and $(f_1+f_2)$ modK.

The second modular operator 542 receives inputs of K and the output value of the second adder 512 and performs the modular operation described through FIG. 3.

The third adder 513 receives an input of the output value of the second modular operator 542 and outputs a result of the addition of the output value of the second modular operator 542 and the output value of the second D-flip flop 532. In an initial performance, it is not possible to receive the output value of the second D-flip flop 532 so the output value is in an unknown state.

The third modular operator 543 receives inputs of K and the output value of the third adder 513 and performs the modular operation described through FIG. 3.

The second multiplexer 522 receives inputs of the output value of the third modular operator 543 and "0", outputs "0" in generating a first index by a control signal, and then outputs the output value of the third adder 543 after that. The reason why "0" is generated as the first index is that a first index of the interleaver should be "0" and also a first output value of the third adder 543 is in an unknown state.

The second D-flip flop 532 receives an input of the output value of the second multiplexer 522 and temporarily stores the output value of the second multiplexer 522 because a loop-back is performed in which the output value of the second multiplexer 522 is used in the third adder 513.

Referring back to FIG. 3, it is preferable that the interleaver index generating apparatus 500 may be used for deriving an index value for a predetermined bit provided to the index operator 220 from the main processor 210. That is, when the main processor 210 does not provide the index operator 220 with the index value for the predetermined bit, the index for the predetermined bit is operated using the interleaver index generating apparatus 500 and then the operated index may be provided to the index operator 220.

According to another exemplary embodiment of the present invention, the main processor 210 calculates $(128*f_2)$ modK and indexes for $i^{th}$ to $i+15^{th}$ bits (here, i is an integer equal to or larger than 0) of input data and transfers them to the index operator 220. The main processor 210 transfers K, $(128*f_2)$modK, and index values for $i+j^{th}$ and $(i+j)+8^{th}$ bits (here, $0 \leq j \leq 7$) of input data to each of the eight index operators 220.

The index operator 220 calculates indexes for bits after bits calculated by the main processor 210 in parallel by using the values transferred from the main processor 210 and derives a plurality of indexes.

According to another exemplary embodiment of the present invention, the index operator 220 receives index values for $i+j^{th}$ and $(i+j)+8^{th}$ bits (here, $0 \leq j \leq 7$) of input data from the main processor 210 and calculates an index for an $(i+j)+16^{th}$ bit by using the difference between the indexes.

In FIG. 2, the index value for the $i+j^{th}$ bit of the input data is represented as $\Pi(i_0)$, the index value for the $(i+j)+8^{th}$ bit of the input data is represented as $\Pi(i_1)$. After that, i is represented as $i_m$ in which i is increased by 8. That is, $i_{m+1}$ is equal to $i_m+8$ and $i_{m+2}$ is equal to $i_m+16$.

According to another exemplary embodiment of the present invention, the index operator 220 receives $(128*f_2)$modK and index values for $i+j^{th}$ and $(i+j)+8^{th}$ bits (here, $0 \leq j \leq 7$) of input data from the main processor 220 and calculates an index for an $(i+j)+16^{th}$ bit by using an equation of $$\Pi(i+j+16)=(2*\Pi(i+j+8)-\Pi(i+j)+128*f_2)\bmod K.$$

The index of the interleaver has the following characteristics.
1. All Ki is a multiple of eight.
2. A first index is always "0".
3. A remainder generated by dividing a generated index by eight has a form of being repeated every eight times.
4. When first eight indexes and second eight indexes have been generated, all indexes from third eight indexes may be generated in the unit of eights.

Accordingly, the index of the interleaver satisfies the following equation.

$$\Pi(i+j+16)=(2*\Pi(i+j+8)-\Pi(i+j)+128*f_2)\bmod K$$

For easier understanding, the above equation is organized as follows.

$$\prod(i+8) = \{f_1*(i+8)+f_2*(i+8)^2\}\bmod K$$
$$= \{f_1*i+8*f_1+f_2*i_2+16*f_2*i+64*f_2\}\bmod K$$

The above equation is organized as follows after adding $\Pi(i)$ to and then subtracting $\Pi(i)$ from the above equation.

$$\prod(i+8) = \{f_1*i+8*f_1+f_2*i^2+16*f_2*i+64*f+$$
$$(f_1*i+f_2*i^2)-f_1*i+f_2*i^2)\}\bmod K$$
$$= \{f_1*i+f_1*i+f_2*i^2+f_2*i^2+8*f_1+16*f_2*i+$$
$$64*f_2-(f_1*i+f_2*i^2)\}\bmod K$$
$$= \{2*(f_1*i+f_2*i^2)-(f_1*i-8*f_1)-$$
$$(f_2*i^2-16*f_2*i-64*f_2\}\bmod K$$

The above equation is organized as follows after adding $128*f_2$ to and then subtracting $128*f_2$ from the above equation.

$$\prod(i+8) = \{2*(f_1*i+f_2*i^2)+128*f_2-128*f_2-(f_1*i-8*f_1)-$$
$$(f_2*i^2-16*f_2*i-64*f_2\}\bmod K$$
$$= \{2*(f_1*i+f_2*i^2)-(f_1*i-8*f_1)-$$
$$(f_2*i^2-16*f_2*i+64*f_2)+128*f_2\}\bmod K$$
$$= \{2*(f_1*i+f_2*i^2)-f_1*(i-8)-f_2*(i-8)^2+128*f_2\}\bmod K$$
$$= \{2*\prod(i)-\prod(i-8)+128*f_2\}\bmod K$$

It is preferable that the index generator 220 includes the first storage apparatus 221, the second storage apparatus 222, and the subsequent-index generator 223. The index generator 220 receives $\Pi(i_0)$, $\Pi(i_1)$, $(128*f_2)$modK, and K from the main processor 210, calculates indexes after $\Pi(i_0)$, and enables outputs to be sequentially output from $\Pi(i_0)$.

The first storage apparatus 221 receives $\Pi(i_0)$ from the main processor 210 and stores the received $\Pi(i_0)$ at first. After that, the first storage apparatus 221 sequentially receives $\Pi(i_{m+1})$ stored in the second storage apparatus 222 and stores the received $\Pi(i_{m+1})$. Further, the first storage apparatus 221 transfers stored values to the subsequent-index generator 223. And then the first storage apparatus 221 sequentially outputs stored values as output values of the index operator 220.

For example, the first storage apparatus 221 stores and outputs first $\Pi(i_0)$, the second storage apparatus 222 receives the first stored $\Pi(i_1)$ and then stores and outputs the received $\Pi(i_1)$, and then the second storage apparatus 222 receives $\Pi(i_2)$ output through $\Pi(i_0)$ and $\Pi(i_1)$ by the subsequent-index generator 223 and then stores and outputs the received $\Pi(i_2)$. That is, the first storage apparatus 221 sequentially stores values from $\Pi(i_0)$ to $\Pi(i_m)$, transfers them to the subsequent-index generator 223, and outputs them as output values of the index operator 220.

The second storage apparatus 222 receives $\Pi(i_1)$ from the main processor 210 and stores the received $\Pi(i_1)$. After that, the second storage apparatus 222 receives $\Pi(i_{m+2})$, which is an output value of the subsequent-index generator 223, and stores the received $\Pi(i_{m+2})$. Further, the second storage apparatus 222 transfers stored values to the subsequent-index generator 223 and the first storage apparatus 221. That is, the second storage apparatus 222 sequentially stores values from $\Pi(i_1)$ to $\Pi(i_{m+1})$ and transfers them to the subsequent-index generator 223 and the first storage apparatus 221.

The subsequent-index generator 223 calculates $\Pi(i_{m+2})$ by using K, $\Pi(i_m)$ and $\Pi(i_{m+1})$ received from the first storage apparatus 221 and the second storage apparatus 223, and $(128*f_2)$modK received from the main processor 210. It is preferable that the subsequent-index generator 223 calculates $\Pi(i_{m+2})$ by using the following equation $\Pi(i_{m+2})=(2*\Pi(i_{m+1})-\Pi(i_m)+128*f_2)$modK. Further, the subsequent-index generator 223 transfers the calculated $\Pi(i_{m+2})$ to the second storage apparatus 222.

It is preferable that there are eight index operators 220 and the eight index operators receive ($\Pi(0)$, $\Pi(8)$), ($\Pi(1)$, $\Pi(9)$), ($\Pi(2)$, $\Pi(10)$), ($\Pi(3)$, $\Pi(11)$), ($\Pi(4)$, $\Pi(12)$), ($\Pi(5)$, $\Pi(13)$), ($\Pi(6)$, $\Pi(14)$), ($\Pi(7)$, $\Pi(15)$) to output $\Pi(n*8)$, $\Pi(n*8+1)$, $\Pi(n*8+2)$, $\Pi(n*8+3)$, $\Pi(n*8+4)$, $\Pi(n*8+5)$, $\Pi(n*8+6)$, $\Pi(n*8+7)$, respectively (n is an integer equal to or larger than 2 and equal to or smaller than (K/8−1)).

Figure 4:
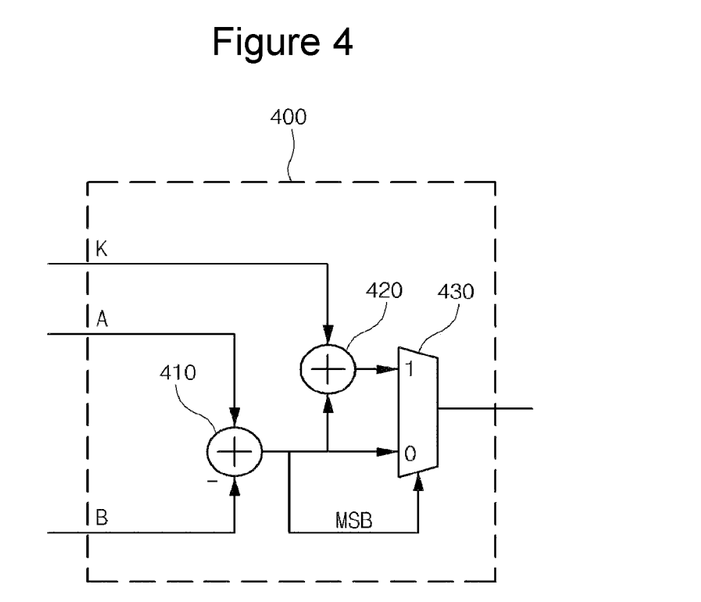
FIG. 4 is a diagram illustrating a modular circuit according to another embodiment of the present invention.

FIG. 4 is a diagram illustrating a modular circuit 400 according to another embodiment of the present invention. Referring to FIG. 4, the modular circuit 400 according to another embodiment of the present invention includes a first adder 410, a second adder 420, and a multiplexer 430 and receives a first input, a second input, and a divisor K.

The first adder 410 adds the first input and a sign inverted second input and outputs the added value. That is, the first adder 410 subtracts the second input from the first input.

The second adder 420 adds the output value of the first adder 410 and the divisor K and outputs the added value.

The multiplexer 430 receives inputs of the output value of the first adder 410 and the output value of the second adder 420. The multiplexer outputs the output value of the first adder 410 when the output value of the first adder 410 is a positive number and outputs the output value of the second adder 420 when the output value of the first adder 410 is a negative number.

Figure 6:
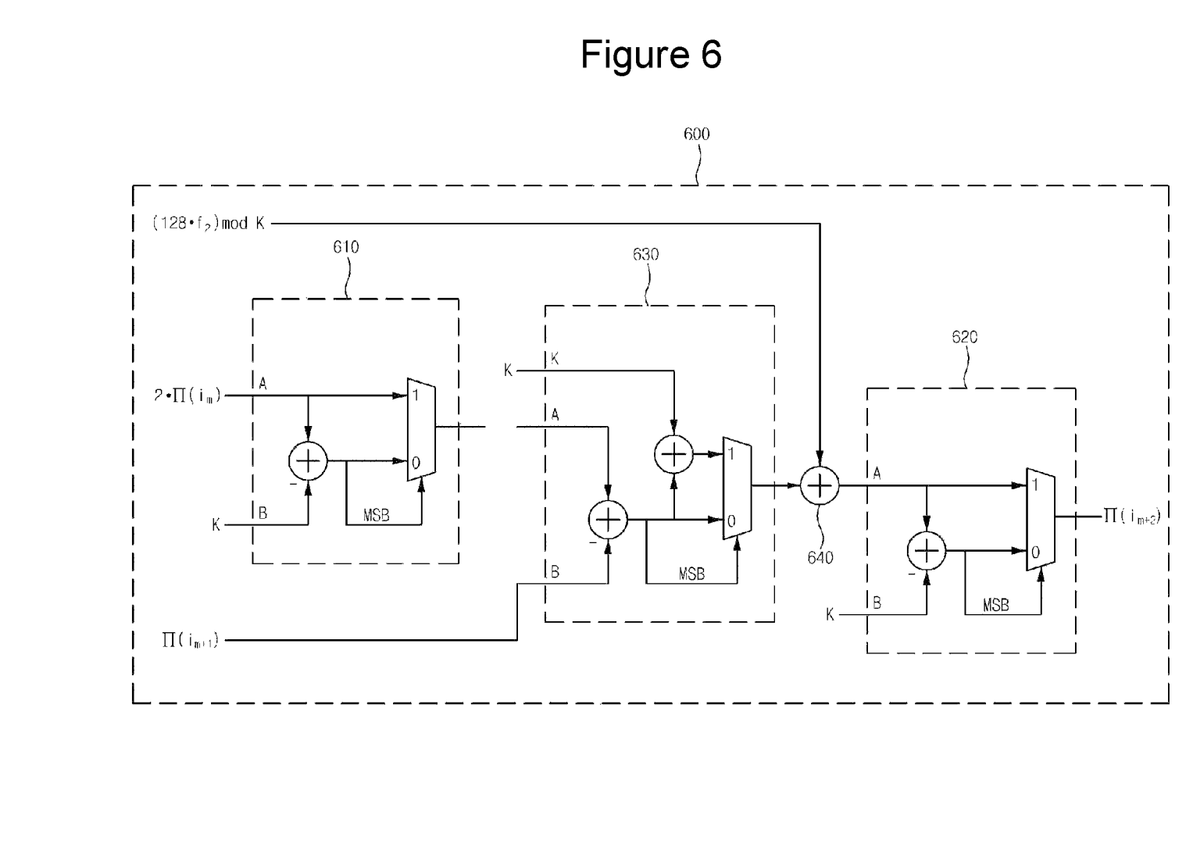
FIG. 6 is a diagram illustrating a subsequent-index generator according to an embodiment of the present invention.

FIG. 6 is a diagram illustrating a subsequent-index generator according to an embodiment of the present invention. Referring to FIG. 6, the subsequent-index generator 600 according to the embodiment of the present invention includes two modular operators 610 and 620 described through FIG. 3, one modular operator 630 described through FIG. 4, and one adder 640. The subsequent-index generator 600 receives inputs of $(128*f_2) \bmod K$, $2*\Pi(i_m)$, K, and $\Pi(i_{m+1})$ and outputs $\Pi(i_{m+2})$.

It is preferable that $2*\Pi(i_m)$ received by the subsequent-index generator 600 according to the embodiment of the present invention may be operated by applying a bit shift through a reception of $\Pi(i_m)$ without the use of multiplier.

The first modular operator 610 receives inputs of $2*\Pi(i_m)$ and K, and performs the modular operation described in FIG. 3.

The second modular operator 630 receives inputs of the output value of the first modular operator 610, $\Pi(i_{m+1})$, and K, and performs the modular operation described in FIG. 4.

The adder 640 adds the output value of the second modular operator 630 and $(128*f_2) \bmod K$ and outputs the added value.

The third modular operator 620 receives inputs of the output value of the adder 640 and K, and performs the modular operation described in FIG. 3.

The output value of the third modular operator 620 corresponds to the output value of the subsequent-index generator 600, which is $\Pi(i_{m+2})$.

It is preferable that the aforementioned multiplexer can determine whether an input value is a negative number or a positive number by using a most significant bit value.

Figure 7:
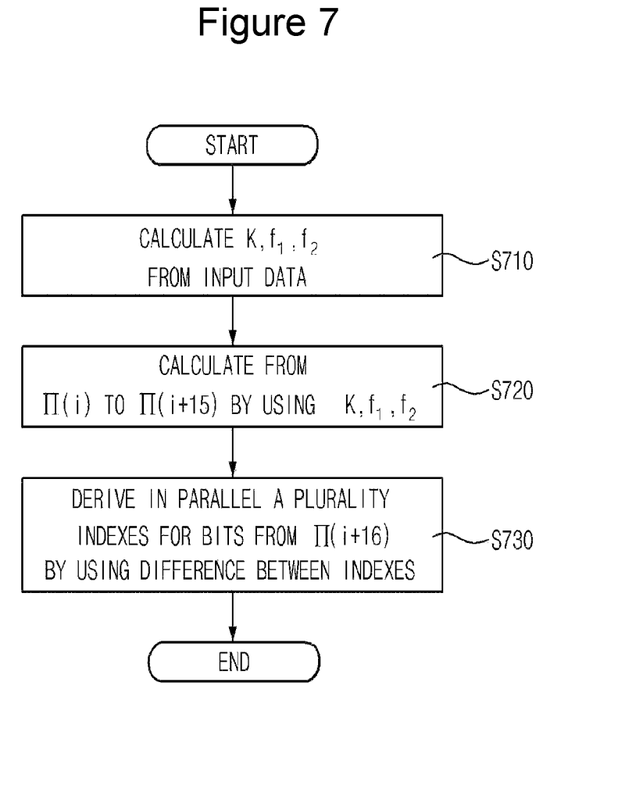
FIG. 7 is a flowchart illustrating an interleaver index generating method according to an embodiment of the present invention.

FIG. 7 is a flowchart illustrating an interleaver index generating method according to an embodiment of the present invention. Referring to FIG. 7, the interleaver index generating method according to the embodiment of the present invention includes calculating K, $f_1$, and $f_2$ from input data in step S710, calculating values of indexes from $\Pi(i)$ to $\Pi(i+15)$ for $i^{th}$ to $i+15^{th}$ bits, which are predetermined bits of the input data, by using the K, $f_1$, and $f_2$ calculated in step S710 in step S720, and calculating in parallel values from $\Pi(i+16)$ by using the values from $\Pi(i)$ to $\Pi(i+15)$ calculated in step S720 and differences between the index values in step S730.

In step S710, the index generating apparatus calculates K, $f_1$, and $f_2$ from input data.

In step S720, the index generating apparatus calculates indexes for predetermined bits of the input data by using K, $f_1$, and $f_2$ calculated in step S710.

According to an exemplary embodiment of the present invention, the index generating apparatus calculates differences between index values for bits by using the following equation $\Pi(i+1)-\Pi(i)=(f_1+f_2+2*f_2*i) \bmod K$, and calculates indexes for bits from an $i+1^{th}$ bit by using the calculated differences in step S720.

According to an exemplary embodiment of the present invention, the modular operation is performed using an addition and the multiplexer. The addition refers to an addition of the dividend and the sign inverted divisor of the modular operation, and the multiplexer receives inputs of a result of the addition and the dividend. The multiplexer outputs the dividend when the result of the addition is a negative number and outputs the result of the addition when the result of the addition is a positive number.

According to another exemplary embodiment of the present invention, the index generating apparatus calculates indexes for $i^{th}$ to $i+15^{th}$ bits (here, i is an integer equal to or larger than 0) of input data and $(128*f_2) \bmod K$ in step S720.

In step S730, the index generating apparatus calculates in parallel indexes for bits after the bit calculated using the index values calculated in step S720.

According to an exemplary embodiment of the present invention, the index generating apparatus calculates indexes for bits from an $i+16^{th}$ bit by using the following equation $$\Pi(i+j+16)=(2*\Pi(i+j+8)-\Pi(i+j)+128*f_2) \bmod K$$

(here, $0 \leq j \leq 7$) in step S730.

According to another exemplary embodiment of the present invention, the index generating apparatus receives a first input, a second input, and an input of the divisor K, and uses the modular operation performed using a first addition, a second addition, and the multiplexer in step S730. Each of the operations used in the modular operation is as follows.

The first addition refers to an addition of the first input and a sign inverted second input, and the second addition refers to an addition of a result of the first addition and the divisor K. The multiplexer receives inputs of the result of the first addition and a result of the second addition.

While the detailed description of the present invention has described certain exemplary embodiments such as a portable terminal, it will be understood by those skilled in the art that various changes in form and details may be made therein without departing from the spirit and scope of the invention as defined by the appended claims.

REFERENCE NUMERALS

200: Interleaver Index Generating Apparatus
210: Main Processor 220: Index Operator
221: First Storage Apparatus 222: Second Storage Apparatus
223: Subsequent-Index Generator

The invention claimed is:

1. An apparatus for generating indexes of an interleaver for input data, the apparatus comprising:
   a main processor for calculating an index for a predetermined bit of the input data; and
   an index operator for receiving the index calculated by the main processor, calculating in parallel indexes for bits after the predetermined bit, and deriving a plurality of indexes,
   wherein the main processor calculates the index for $i^{th}$ to $(i+15)^{th}$ bits of the input data where i is an integer equal to or larger than 0, and transfers a result of $(128*f_2) \bmod K$ to the index operator, and
   wherein the index operator calculates an index for an $(i+j+16)^{th}$ bit where j is an integer which satisfies $0 \leq j \leq 7$ by using an equation of $\Pi(i+j+16)=(2*\Pi(i+j+8)-\Pi(i+j)+128*f_2) \bmod K$ where K is a size of the input data and $f_2$ is a coefficient calculated from K.

2. The apparatus as claimed in claim 1, wherein a modular operation of the equation is performed using an adder and a multiplexer.

3. The apparatus as claimed in claim 2, wherein the adder performs an addition of a dividend of the modular operation and a sign inverted divisor of the modular operation, and the multiplexer receives the dividend and a result of the addition, wherein the multiplexer outputs the dividend when the result of the addition is a negative number and outputs the result of the addition when the result of the addition is a positive number.

4. The apparatus as claimed in claim 1, wherein a modular operation of the equation is performed using a first adder, a second adder, and a multiplexer through receptions of a first input, a second input, and a divisor equal to K where K is the size of the input data.

5. The apparatus as claimed in claim 4, wherein the first adder adds the first input and a sign inverted second input, the second adder adds a result of the first adder and a divisor equal to K where K is the size of the input data, and the multiplexer receives inputs of the result of the first adder and a result of the second adder and outputs the result of the second adder when the result of the first adder is a negative number and outputs the result of the first adder when the result of the first adder is a positive number.

6. A method of generating indexes of an interleaver for input data, the method comprising:
    performing a first step by calculating an index for a predetermined bit of the input data; and
    performing a second step by calculating indexes for bits after the predetermined bit in parallel by using the index calculated in the first step,
    wherein, in the first step, the index is calculated for ith to $(i+15)^{th}$ bits of the input data where i is an integer equal to or larger than 0, and a result of $(128*f_2)$modK is obtained, and
    wherein, in the second step, the index is calculated for an $(i+j+16)$th bit where j is an integer which satisfies $0 \leq j \leq 7$ by using an equation of:

$\Pi(i+j+16)=(2*\Pi(i+j+8)-\Pi(i+j)+128,f_2)$modK where K is a size of the input data and $f_2$ is a coefficient calculated from K.

7. The method as claimed in claim 6, wherein a modular operation of the equation is performed using an adder and a multiplexer,
    wherein the adder adds a dividend and a sign inverted divisor of the modular operation, and the multiplexer receives inputs of the dividend and a result of the adder,
    wherein the multiplexer outputs the dividend when the result of the adder is a negative number and outputs the result of the adder when the result of the adder is a positive number.

8. The method as claimed in claim 6, wherein a modular operation of the equation is performed using a first adder, a second adder, and a multiplexer through receptions of a first input, a second input, and a divisor equal to K where K is the size of the input data,
    wherein the first adder performs a first addition which is an addition of the first input and a sign inverted second input, the second adder performs a second addition which is an addition of a result of the first addition and K, and the multiplexer receives inputs of the result of the first addition and a result of the second addition and outputs the result of the second adder addition when the result of the first adder addition is a negative number and outputs the result of the first addition when the result of the first addition is a positive number.

* * * * *